(12) United States Patent
Park et al.

(10) Patent No.: US 11,363,710 B2
(45) Date of Patent: Jun. 14, 2022

(54) CIRCUIT BOARD

(71) Applicant: SAMSUNG SDI CO., LTD., Yongin-si (KR)

(72) Inventors: Seokryun Park, Yongin-si (KR); Seokbong Lee, Yongin-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 61 days.

(21) Appl. No.: 16/966,172

(22) PCT Filed: Jan. 2, 2019

(86) PCT No.: PCT/KR2019/000029
§ 371 (c)(1),
(2) Date: Jul. 30, 2020

(87) PCT Pub. No.: WO2019/164118
PCT Pub. Date: Aug. 29, 2019

(65) Prior Publication Data
US 2020/0375023 A1 Nov. 26, 2020

(30) Foreign Application Priority Data
Feb. 22, 2018 (KR) .................. 10-2018-0021080

(51) Int. Cl.
*G06F 1/16* (2006.01)
*H05K 1/02* (2006.01)
(Continued)

(52) U.S. Cl.
CPC .......... *H05K 1/0219* (2013.01); *H05K 1/147* (2013.01); *H05K 1/189* (2013.01);
(Continued)

(58) Field of Classification Search
CPC ...... H05K 1/0219; H05K 1/147; H05K 1/189; H05K 2201/09309; H05K 2201/09345; H05K 2201/10037
See application file for complete search history.

(56) References Cited

U.S. PATENT DOCUMENTS

2004/0167378 A1* 8/2004 Ando ................... H04N 5/2253 600/109
2012/0293470 A1* 11/2012 Nakata ................ G02F 1/13452 345/204
(Continued)

FOREIGN PATENT DOCUMENTS

JP 2013-030722 A 2/2013
KR 10-2008-0012527 2/2008
(Continued)

OTHER PUBLICATIONS

International Search Report dated Apr. 12, 2019 for PCT/KR2019/000029.
European Search Report dated Oct. 20, 2021.

*Primary Examiner* — Binh B Tran
(74) *Attorney, Agent, or Firm* — Lee IP Law, PC

(57) ABSTRACT

An embodiment provides a circuit board including: a terminal part including a plurality of first terminals, a body part spaced apart from the terminal part and including a plurality of second terminals, and a wire part between the terminal part and the body part, wherein the wire part includes a power wire and a ground wire connecting the plurality of first terminals and the plurality of second terminals, and the ground wire is disposed more outward than the power wire, within the wire part.

20 Claims, 6 Drawing Sheets

(51) Int. Cl.
*H05K 1/14* (2006.01)
*H05K 1/18* (2006.01)

(52) U.S. Cl.
CPC .............. *H05K 2201/09309* (2013.01); *H05K 2201/09345* (2013.01); *H05K 2201/10037* (2013.01)

(56) References Cited

U.S. PATENT DOCUMENTS

| | | |
|---|---|---|
| 2012/0325550 A1 | 12/2012 | Hayashi |
| 2013/0308282 A1 | 11/2013 | Shin et al. |
| 2015/0068796 A1* | 3/2015 | Jung .................... H05K 1/025 |
| | | 174/262 |
| 2016/0141594 A1 | 5/2016 | Hwang et al. |
| 2016/0249456 A1 | 8/2016 | Youn et al. |

FOREIGN PATENT DOCUMENTS

| | | |
|---|---|---|
| KR | 10-2012-0076968 A | 7/2012 |
| KR | 10-2013-0127821 A | 11/2013 |
| KR | 10-1416159 B1 | 7/2014 |
| KR | 10-1474741 B1 | 12/2014 |
| KR | 10-2016-0102769 A | 8/2016 |

* cited by examiner

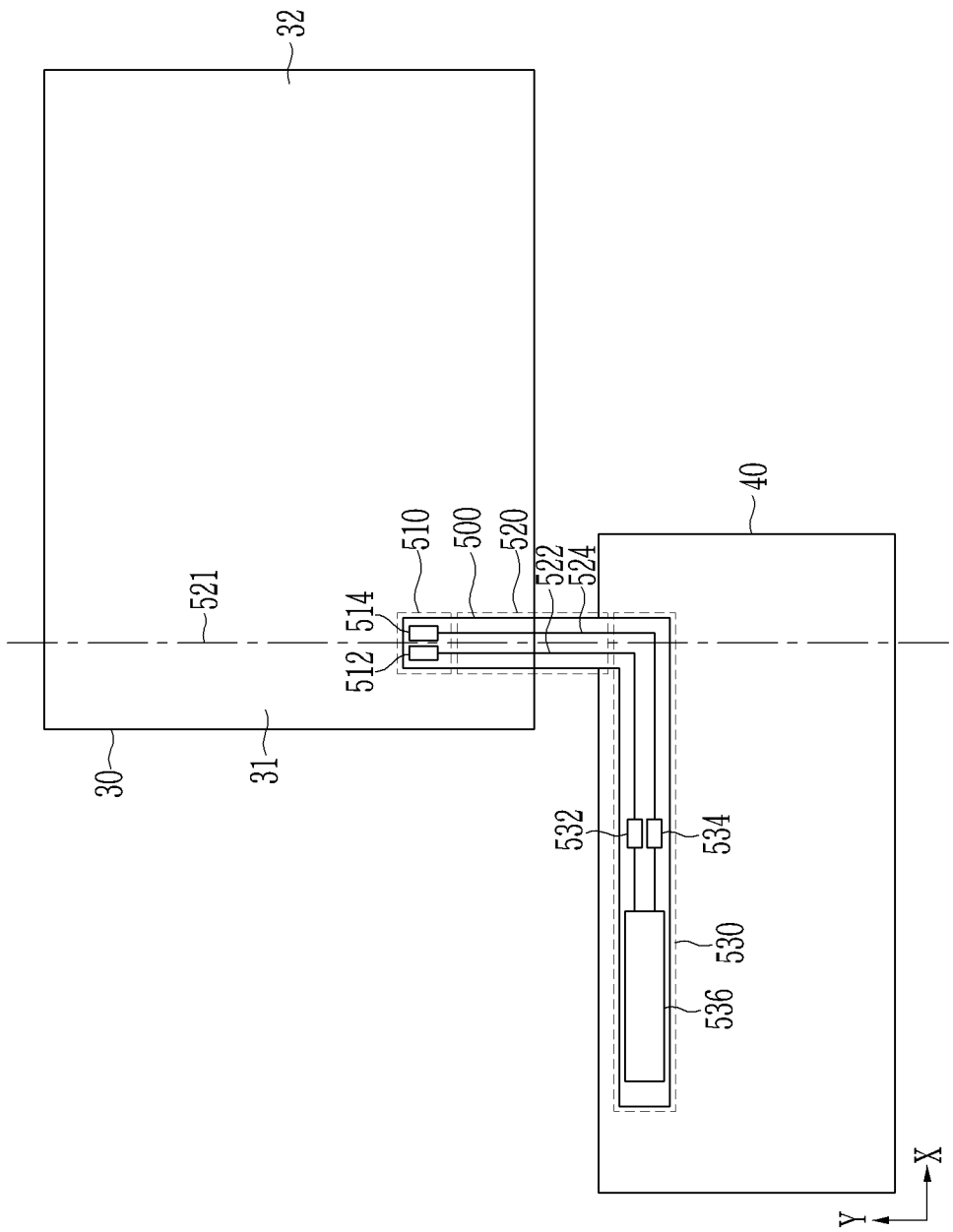

CIRCUIT BOARD

CROSS REFERENCE TO RELATED APPLICATIONS

This is the U.S. national phase application based on PCT Application No. PCT/KR2019/000029, filed Jan. 2, 2019, which is based on Korean Patent Application No. 10-2018-0021080, filed Feb. 22, 2018, the entire contents of all of which are hereby incorporated by reference.

TECHNICAL FIELD

The present disclosure relates to a circuit board.

BACKGROUND ART

Generally, internal circuits of electronic devices are realized on a circuit board. An internal circuit of such an electronic device is driven by receiving power from a battery module. At this time, electrical connection between the internal circuit and the battery module may be implemented by a circuit board.

Meanwhile, various circuit modules are installed in an internal space of a mobile terminal such as a mobile phone, thus the internal space becomes narrow, so that EMI noise may be generated in the power supplied from the battery module.

Accordingly, a PCB having a shielding layer on a power transmission line has been developed to solve the EMI noise, but a manufacturing cost may be increased by an additional process. Therefore, a transmission line capable of effectively transmitting power without EMI noise is required.

DISCLOSURE

Technical Problem

An object of the present invention is to solve the above-mentioned problem and other problems. Another object is to provide a circuit board that may shield EMI noise.

Technical Solution

An embodiment for achieving the object and other objects provides a circuit board including: a terminal part including a plurality of first terminals, a body part spaced apart from the terminal part and including a plurality of second terminals, and a wire part between the terminal part and the body part, wherein the wire part includes a power wire and a ground wire connecting the plurality of first terminals and the plurality of second terminals, and the ground wire is disposed more outward than the power wire, within the wire part.

The wire part may be a flexible circuit board.

The circuit board connects the main board and the battery module.

When the main board is divided into two regions by a reference line between the ground wire and the power wire, the ground wire is disposed at a side corresponding to a region having a smaller area among the two divided regions, and the power wire is disposed at a side corresponding to a region having a larger area among the two divided regions, within the wire part.

When a plurality of modules are mounted on the main board, the ground wire is disposed at a side further spaced apart from the plurality of modules than the power wire, within the wire part.

Each of the terminal part, the body part, and the wire part includes a base layer, a first copper foil layer on the base layer, a first plating layer on the first copper foil layer, a second copper foil layer under the base layer, and a second plating layer under the second copper foil layer.

Each of the first copper foil layer and the second copper foil layer of the wire part includes the power wire and the ground wire, and the ground wire of the first copper foil layer and the ground wire of the second copper foil layer are positioned to correspond to each other at respective sides of the wire part.

The first copper foil layer and the second copper foil layer have a thickness of 18 and the first plating layer and the second plating layer have a thickness of 15 µm.

The wire part further includes a first coverlay film attached on the first plating layer through a first adhesive layer and a second coverlay film attached under the second plating layer through a second adhesive layer, and the base layer, the first coverlay film, and the second coverlay film are formed of a resin material.

In the terminal part, the first copper foil layer and the second copper foil layer are connected to each other through a contact hole.

A battery protection IC (integrated circuit) protecting the battery module is mounted in the body part.

Advantageous Effects

According to the present invention, it is possible to transmit a signal in which EMI noise is reduced through a transmission line of a circuit board.

According to the present invention, it is possible to produce a circuit board capable of shielding EMI noise with a low cost.

DESCRIPTION OF THE DRAWINGS

FIG. 6 illustrates an internal block diagram of an electronic device connected by a circuit board according to another embodiment.

MODE FOR INVENTION

Figure 1:
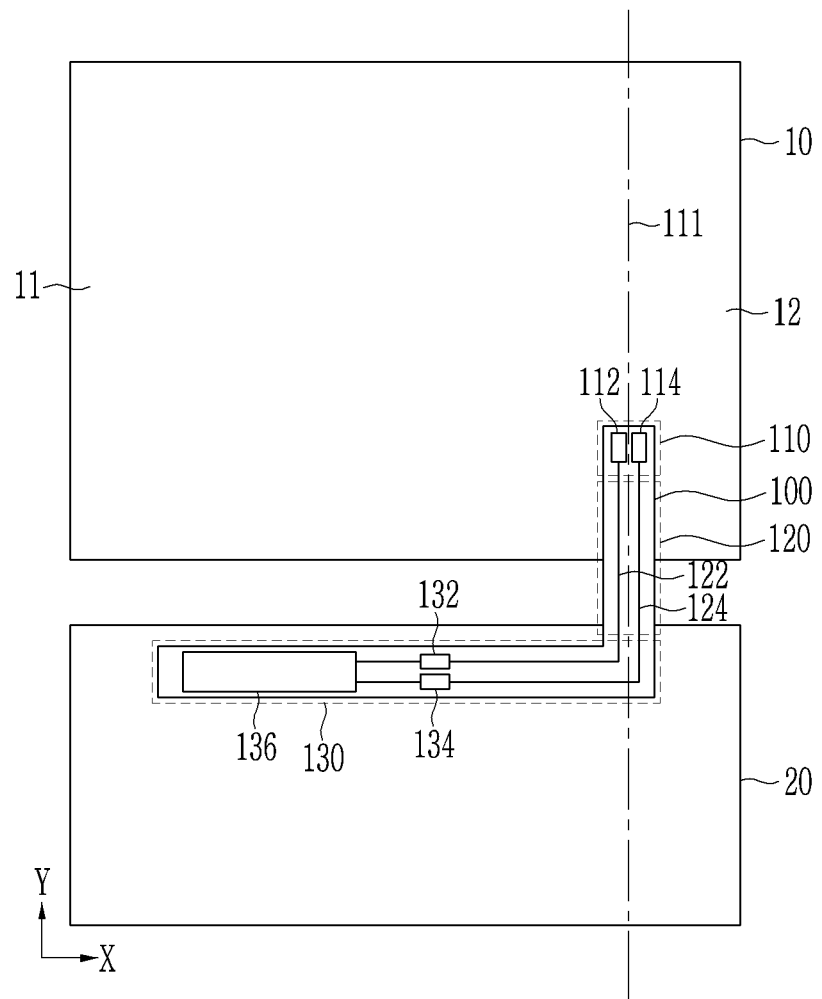
FIG. 1 illustrates an internal block diagram of an electronic device connected by a circuit board according to an embodiment.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present disclosure.

The terms "module", "part", "portion", and "unit" representing constituent elements used in the following description are used only in order to make understanding of the specification easier. Therefore, these terms do not have meanings or roles that distinguish them from each other by themselves. In addition, in describing exemplary embodiments of the present specification, when it is determined that a detailed description of the well-known art associated with the present invention may obscure the gist of the present invention, it will be omitted.

Parts that are irrelevant to the description will be omitted to clearly describe the present disclosure, and like reference numerals designate like elements throughout the specification.

Further, in the drawings, the size and thickness of each element are arbitrarily illustrated for ease of description, and the present disclosure is not necessarily limited to those illustrated in the drawings. In the drawings, the thicknesses of layers, films, panels, areas, regions, etc. are exaggerated for clarity. In the drawings, for ease of description, the thicknesses of some layers and areas are exaggerated.

It will be understood that when an element such as a layer, film, region, board, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Further, throughout the specification, the phrase "in a plan view" or "on a plane" means viewing a target portion from the top, and the phrase "in a cross-section" or "on a cross-section" means viewing a cross-section formed by vertically cutting a target portion from the side.

Terms including ordinal numbers such as first, second, and the like will be used only to describe various constituent elements, and are not to be interpreted as limiting these constituent elements. The terms are only used to differentiate one constituent element from other constituent elements.

It is to be understood that when one constituent element is referred to as being "connected" or "coupled" to another constituent element, it may be connected or coupled directly to the other constituent element or be connected or coupled to the other constituent element with a further constituent element intervening therebetween. On the other hand, it is to be understood that when one constituent element is referred to as being "connected or coupled directly" to another constituent element, it may be connected to or coupled to the other constituent element without another constituent element intervening therebetween.

It will be further understood that terms "comprises" or "have" used in the present specification specify the presence of stated features, numerals, steps, operations, constituent elements, parts, or a combination thereof, but do not preclude the presence or addition of one or more other features, numerals, steps, operations, constituent elements, parts, or a combination thereof.

Hereinafter, a circuit board according to an embodiment of the present invention will be described in detail with reference to the accompanying drawings.

FIG. 1 illustrates an internal block diagram of an electronic device connected by a circuit board 100 according to an embodiment.

As illustrated, a main board 10, a battery module 20, and the circuit board 100 connecting the main board 10 and the battery module 20 are mounted inside the electronic device.

The main board 10 may include a plurality of modules (not shown) that drive electronic devices. For example, a processor module such as a CPU, a digital signal processor (DSP), an application-specific integrated circuit (ASIC), and a field programmable gate array (FPGA), a memory chip such as a random access memory (RAM) and a read-only memory (ROM), a communication module, a display module, and the like may be mounted on the main board 10.

The battery module 20 supplies power to the main board 10. The battery module 20 may be provided as at least one cell (not shown) that is modularized, or may be provided as an assembly of a plurality of cells connected in series or in parallel.

The main board 10 and the battery module 20 are connected by the circuit board 100. The circuit board 100 includes a terminal part 110, a wire part 120, and a body part 130. Here, the circuit board 100 may be a printed circuit board (PCB). More specifically, in some embodiments, the circuit board 100 may be a rigid printed circuit board (rigid PCB), a flexible printed circuit board (FPCB), or a combination of at least two types of printed circuit boards.

The terminal part 110 includes a plurality of terminals 112 and 114 coupled to the main board 10. A first terminal 112 and a second terminal 114 are connected to the main board 10.

The body part 130 includes a plurality of terminals 132 and 134 connected to the battery module 20 and a battery protection IC 136. A third terminal 132 and a fourth terminal 134 are connected to the battery module 20. In addition, the first terminal 112 and the third terminal 132 are connected through a first power transmission line 122, and the second terminal 114 and the fourth terminal 134 are connected through a second power transmission line 124.

The battery protection IC 136 is connected to the two terminals 132 and 134 to protect the battery module 20 from failures due to overcharge, overdischarge, overcurrent, and temperature rise. For example, when a failure occurs in the battery module 20, the battery protection IC 136 may release electrical connection between the battery module 20 and the main board 10.

The wire part 120 includes the power transmission lines 122 and 124. The power transmission lines 122 and 124 transmit power from the battery module 20 to the main board 10. The power transmission lines 122 and 124 include a power wire 122 and a ground wire 124.

Within the wire part 120, the ground wire 124 is disposed more outward than the power wire 122. For example, when the ground wire 124 is disposed more outward than the power wire 122, in a case in which the main board 10 is divided into two regions 11 and 12 by a reference line 111 between the ground wire 124 and the power wire 122, the ground wire 124 may be disposed at a side corresponding to the region 12 having a smaller area among the two divided regions 11 and 12, in the wire part 120, and the power wire 122 may be disposed on a side corresponding to the region 11 having a larger area among the two divided regions 11 and 12, within the wire part 120.

As another example, when the ground wire 124 is disposed more outward than the power wire 122, the ground wire 124 is disposed at a side further spaced apart from the module mounted on the main board 10 than the power wire 122, within the wire part 120. When more modules are mounted in the region 11 compared to the region 12, the ground wire 124 may be disposed corresponding to the region 12 in which fewer modules are mounted.

Since the ground wire 124 is disposed more outward than the power wire 122 within the wire part 120, the ground wire 124 may shield EMI noise from the outside.

In this regard, the circuit board 100 will be described in detail with reference to FIG. 2 and FIG. 3.

Figure 2:
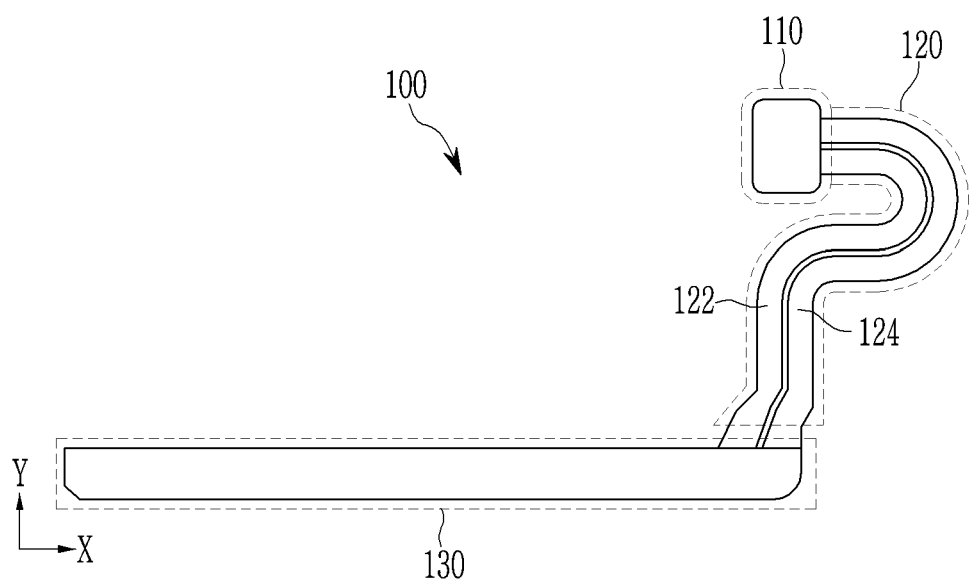
FIG. 2 illustrates a top plan view of a circuit board according to an embodiment.
Figure 3:
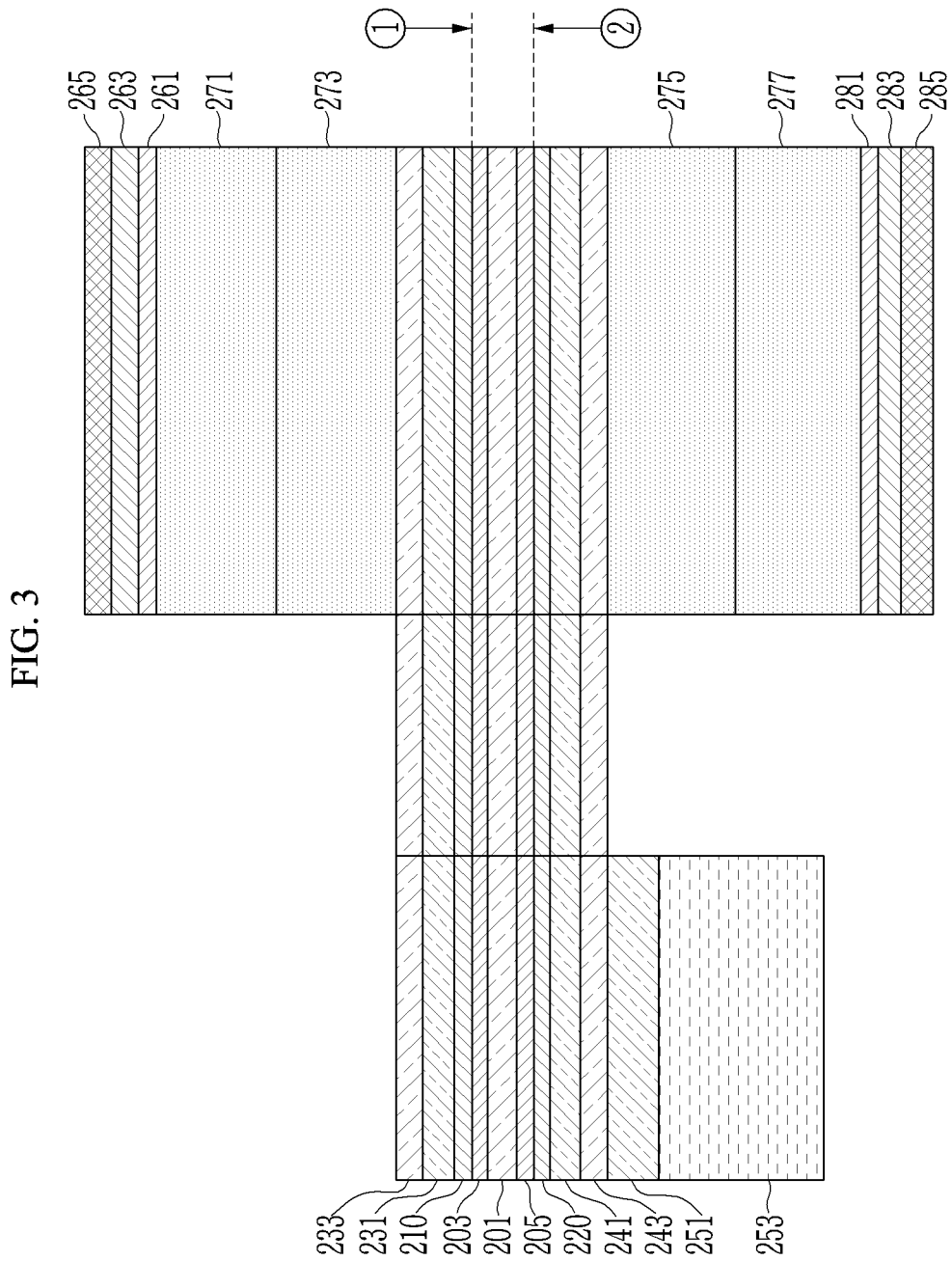
FIG. 3 illustrates a schematic cross-sectional view of a stacked structure of a circuit board according to an embodiment.

FIG. 2 illustrates a top plan view of the circuit board 100 according to the embodiment, and FIG. 3 illustrates a schematic cross-sectional view of a stacked structure of the circuit board 100 according to the embodiment.

As illustrated in FIG. 2, the circuit board 100 includes the terminal part 110, the wire part 120, and the body part 130. The ground wire 124 is disposed more outward than the power wire 122 in the wire part 120, within the wire part 120.

The circuit board 100 may include three different regions. A first region 200a is a region in which the terminal part 110 of the circuit board 100 is formed, a second region 200b is a region in which the wire part 120 is formed, and a third region 200c is a region in which the body part 130 is formed.

The first to third regions 200a to 200c commonly include a first base layer 201, a first copper foil layer 203 on the first base layer 201, a first plating layer 210 on the first copper foil layer 203, a second copper foil layer 205 under the first base layer 201, a second plating layer 220 under the second copper foil layer 205, a first coverlay film 233 attached on the first plating layer 210 through an adhesive layer 231, and a second coverlay film 243 attached under the second plating layer 220 through an adhesive layer 241.

The power wire 122 and the ground wire 124 are formed by the first copper foil layer 203 and the second copper foil layer 205. Each of the first and second copper foil layers 203 and 205 preferably has a thickness of about 18 μm, the first base layer 201 between the first and second copper foil layers 203 and 205 preferably has a thickness of about 25 μm, and the first and second plating layers 210 and 220 preferably have a thickness of about 15 μm.

In this case, the first and second plating layers 210 and 220 are formed to improve corrosion resistance and wear resistance of the first and second copper foil layers 203 and 205.

The first base layer 201, the first coverlay film 233, and the second coverlay film 243 may include a resin-based material such as polyimide or polyester.

In the first region 200a and the third region 200c, the first copper foil layer 203 and the second copper foil layer 205 may be connected to each other through a contact hole (not shown).

The first region 200a includes a reinforcing plate 253 under the second coverlay film 243. Since the first terminal 112 and the second terminal 114 are mounted in the first region 200a, damage to the first terminal 112 and the second terminal 114 is prevented, and the reinforcing plate 253 is formed on a back surface of the second coverlay film 243 through an adhesive layer 251 so that the first terminal 112 and the second terminal 114 are easily coupled to the main board 10.

The third region 200c may further include insulating layers 271 and 273 on the first coverlay film 233, a third copper foil layer 261 on the insulating layers 271 and 273, a third plating layer 263 on the third copper foil layer 261, and a PSR layer 265 on the third plating layer 263. In addition, the third region 200c may further include insulating layers 275 and 277 under the second coverlay film 243, a fourth copper foil layer 281 under the insulating layers 275 and 277, a fourth plating layer 283 under the fourth copper foil layer 281, and a PSR layer 285 under the fourth plating layer 283.

Arrangement of the first copper foil layer 203 and the second copper foil layer 205 as the power wire 122 and the ground wire 124 will be described with reference to FIG. 4 and FIG. 5.

Figure 4:
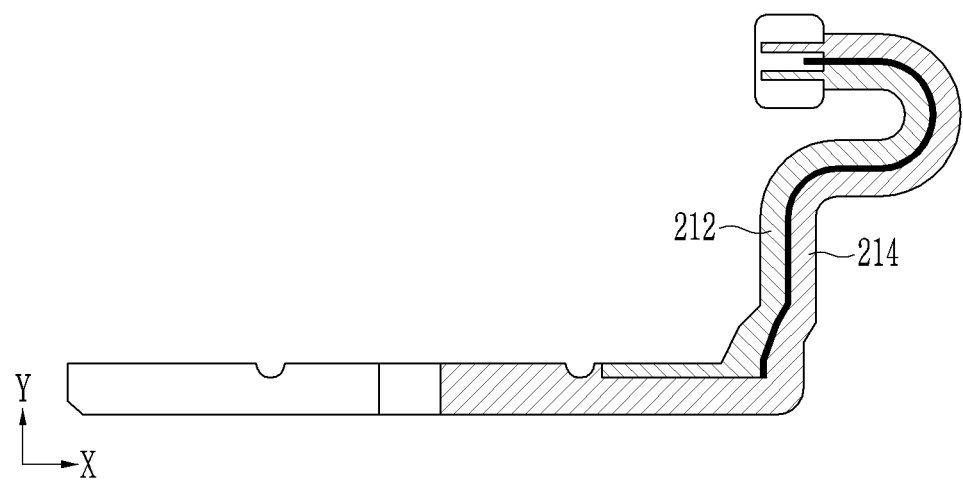
FIG. 4 illustrates a top plan view of a first copper foil layer of a circuit board according to an embodiment.
Figure 5:
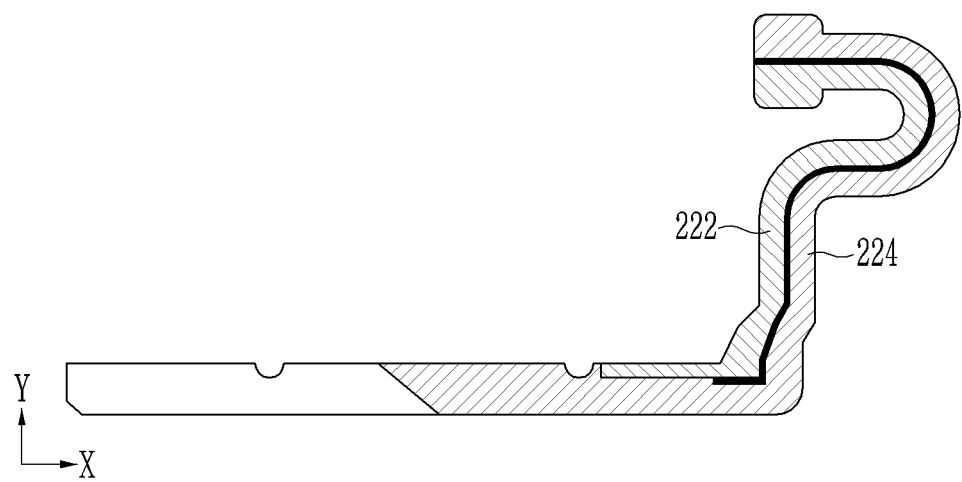
FIG. 5 illustrates a top plan view of a second copper foil layer of a circuit board according to an embodiment.

FIG. 4 illustrates a top plan view of the first copper foil layer 203 of the circuit board 100 according to the embodiment, and FIG. 5 illustrates a top plan view of the second copper foil layer 205 of the circuit board 100 according to the embodiment.

As shown in FIG. 4, a first copper foil layer 214 as the ground wire 124 is disposed more outward than a first copper foil layer 212 as the power wire 122.

Similarly, as shown in FIG. 5, a second copper foil layer 224 as the ground wire 124 is disposed more outward than a second copper foil layer 222 as the power wire 122.

That is, the ground wire 124 may be disposed more outward than the power wire 122 within the wire part 120 to block EMI noise from the outside to be transmitted to the power wire 122.

Hereinafter, a circuit board 500 according to another embodiment will be described with reference to FIG. 6.

FIG. 6 illustrates an internal block diagram of an electronic device connected by the circuit board 500 according to another embodiment.

As shown, a main board 30 and a battery module 40 are connected through the circuit board 500. Description of the main board 30, the battery module 40, and the circuit board 500 of FIG. 5 that are the same as or similar to that of the main board 10, the battery module 20, and the circuit board 100 of FIG. 1, and will be omitted.

A shape of the circuit board 500 of FIG. 5 is the same as that of the circuit board 100 of FIG. 1, but the positions of a ground wire 524 and a power wire 522 in a wire part 520 are different from each other. In the case of the circuit board 500 of FIG. 5, when the main board 30 is divided into two regions 31 and 32 by a reference line 521 between the ground wire 524 and the power wire 522, the ground wire 524 is disposed at a side corresponding to the region 31 having a smaller area among the two divided regions 31 and 32, within the wire part 520, and the power wire 522 is disposed at a side corresponding to the region 32 having a larger area among the two divided regions 31 and 32, within the wire part 520. That is, within the wire part 520, the ground wire 524 is disposed more outward than the power wire 522.

As another example, when more modules are mounted in the region 32 than the region 31, the ground wire 524 is disposed corresponding to the region 31 in which fewer modules are mounted, so that within the wire part 520, the ground wire 524 is disposed more outward than the power wire 522.

That is, the ground wire 524 may be disposed more outward than the power wire 522 within the wire part 520 to block EMI noise from the outside to be transmitted to the power wire 522.

While this invention has been described in connection with what is presently considered to be practical exemplary embodiments, it is to be understood that the invention is not limited to the disclosed embodiments. On the contrary, it is intended to cover various modifications and equivalent arrangements included within the spirit and scope of the appended claims.

The invention claimed is:

1. A circuit board comprising
a terminal part including a plurality of first terminals, a
  body part spaced apart from the terminal part and including a plurality of second terminals, and a wire part between the terminal part and the body part, wherein:

the wire part includes a power wire and a ground wire connecting the plurality of first terminals and the plurality of second terminals, the ground wire is disposed more outward than the power wire, within the wire part, and each of the terminal part, the body part, and the wire part includes a base layer, a first copper foil layer on the base layer, a first plating layer on the first copper foil layer, a second copper foil layer under the base layer, and a second plating layer under the second copper foil layer.

2. The circuit board of claim 1, wherein
the wire part is a flexible circuit board.

3. The circuit board of claim 1, wherein
the circuit board connects a main board and a battery module.

4. The circuit board of claim 3, wherein
when the main board is divided into two regions by a reference line between the ground wire and the power wire, the ground wire is disposed at a side corresponding to a region having a smaller area among the two divided regions, within the wire part, and
the power wire is disposed at a side corresponding to a region having a larger area among the two divided regions.

5. The circuit board of claim 3, wherein
when a plurality of modules are mounted on the main board, the ground wire is disposed at a side further spaced apart from the plurality of modules than the power wire, within the wire part.

6. The circuit board of claim 3, wherein
a battery protection IC (integrated circuit) protecting the battery module is mounted in the body part.

7. The circuit board of claim 1, wherein
each of the first copper foil layer and the second copper foil layer of the wire part includes the power wire and the ground wire, and
the ground wire of the first copper foil layer and the ground wire of the second copper foil layer are positioned to correspond to each other at respective sides of the wire part.

8. The circuit board of claim 1, wherein
the first copper foil layer and the second copper foil layer have a thickness of about 18 µm, and
the first plating layer and the second plating layer have a thickness of about 15 µm.

9. The circuit board of claim 1, wherein
the wire part further includes a first coverlay film attached on the first plating layer through a first adhesive layer and a second coverlay film attached under the second plating layer through a second adhesive layer, and
the base layer, the first coverlay film, and the second coverlay film are formed of a resin material.

10. The circuit board of claim 1, wherein
in the terminal part, the first copper foil layer and the second copper foil layer are connected to each other through a contact hole.

11. An electronic device comprising:
a main board mounting a processor module;
a battery module supplies power to the main board; and
a circuit board comprising a power wire and a ground wire each connecting between a plurality of first terminals connected to the main board and a plurality of second terminals connected to the battery module,
wherein the ground wire is disposed more outward than the power wire within the circuit board.

12. The electronic device of claim 11, wherein
when the main board is divided into two regions by a reference line between the ground wire and the power wire, the ground wire is disposed at a side corresponding to a region having a smaller area among the two divided regions, within the circuit board, and
the power wire is disposed at a side corresponding to a region having a larger area among the two divided regions.

13. The electronic device of claim 11, wherein
the ground wire is disposed at a side further spaced apart from the processor module than the power wire, within the circuit board.

14. The electronic device of claim 11, wherein
the circuit board includes a base layer, a first copper foil layer on the base layer, a first plating layer on the first copper foil layer, a second copper foil layer under the base layer, and a second plating layer under the second copper foil layer.

15. The electronic device of claim 14, wherein
each of the first copper foil layer and the second copper foil layer of the circuit board includes the power wire and the ground wire, and
the ground wire of the first copper foil layer and the ground wire of the second copper foil layer are positioned to correspond to each other at respective sides of the circuit board.

16. The electronic device of claim 14, wherein
a thickness of the first copper foil layer and the second copper foil layer is thicker than a thickness of the first plating layer and the second plating layer.

17. The electronic device of claim 14, wherein
the circuit board further includes a first coverlay film attached on the first plating layer through a first adhesive layer and a second coverlay film attached under the second plating layer through a second adhesive layer, and
the base layer, the first coverlay film, and the second coverlay film are formed of a resin material.

18. The electronic device of claim 14, wherein
the first copper foil layer and the second copper foil layer are connected to each other through a contact hole.

19. The electronic device of claim 11, wherein
a battery protection IC protecting the battery module is mounted in the circuit board.

20. A circuit board comprising
a terminal part including a plurality of first terminals, a body part spaced apart from the terminal part and including a plurality of second terminals, and a wire part between the terminal part and the body part, wherein:
the wire part includes a power wire and a ground wire connecting the plurality of first terminals and the plurality of second terminals,
the ground wire is disposed more outward than the power wire, within the wire part, and
the circuit board connects a main board and a battery module.

* * * * *